Figure 1:
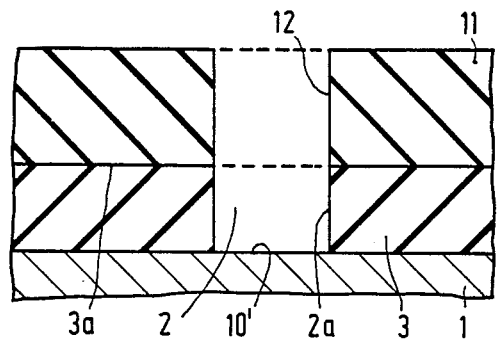

United States Patent [19]

Van Laarhoven

[11] Patent Number: 4,956,312
[45] Date of Patent: Sep. 11, 1990

[54] METHOD OF MANUFACTURING A SEMICONDUCTOR DEVICE

[75] Inventor: Josephus M. F. G. Van Laarhoven, Eindhoven, Netherlands

[73] Assignee: U.S. Philips Corporation, New York, N.Y.

[21] Appl. No.: 354,001

[22] Filed: May 19, 1989

[30] Foreign Application Priority Data

Jun. 6, 1988 [GB] United Kingdom ................ 8813303

[51] Int. Cl.$^5$ ............................................. H01L 21/88
[52] U.S. Cl. ...................................... 437/180; 437/187; 437/194; 437/195; 437/228; 148/DIG. 51
[58] Field of Search ................ 437/180, 194, 195, 228, 437/235, 187, 186; 156/657; 148/DIG. 51

[56] References Cited

U.S. PATENT DOCUMENTS

| | | | |
|---|---|---|---|
| 4,322,883 | 4/1982 | Abbas et al. | 156/657 |
| 4,507,853 | 4/1985 | McDavid | 437/187 |
| 4,586,968 | 5/1986 | Coello-Vera | 156/657 |
| 4,641,420 | 2/1987 | Lee | 437/189 |
| 4,740,484 | 4/1988 | Norström et al. | 437/200 |
| 4,751,198 | 6/1988 | Anderson | 437/200 |
| 4,818,723 | 4/1989 | Yen | 437/200 |

FOREIGN PATENT DOCUMENTS

| | | | |
|---|---|---|---|
| 0062517 | 3/1987 | Japan | 437/187 |
| 0213120 | 9/1987 | Japan | 437/187 |
| 0291943 | 12/1987 | Japan | 437/195 |
| 0296470 | 12/1987 | Japan | 437/186 |

OTHER PUBLICATIONS

"Magnesium Oxide Emitter Sidewall Etching Stop-Layer", IBM Tech. Discl. Bul., vol. 27, No. 12, 5/85, pp. 7159-7160.

"Polysi-Si$_3$N$_4$ Emitter-Base Spacing Definition", IBM Tech. Discl. Bul., vol. 29, No. 4, 9/86, pp. 1865-1866.

Primary Examiner—Brian E. Hearn
Assistant Examiner—Tuan Nguyen
Attorney, Agent, or Firm—Paul R. Miller

[57] ABSTRACT

A method of manufacturing a semiconductor device is described in which electrical contact is provided to an area (10) of an electrically conductive level (1) exposed through an opening (2) in a covering layer (3). A further layer is provided over the covering layer (3) as a first layer (4) of one material provided to a first thickness on the covering layer (3) and a second layer (5) of a different material provided to a second thickness on the first layer. The further layer is then etched anisotropically using an anisotropic etching process which etches the first and second layers (4) and (5) at different rates with the first layer (4) being etched more slowly than the second layer (5) so that, after anisotropic etching to expose the surface (3a) of the covering layer (3) and the area (10) of the electrically conductive level (1), the side walls (2a) of the opening (2) remain covered by the one material (40) and portions (50) of the different material extend on the one material (40) from the exposed area (10) up the side walls (2a) of the opening (2) for a distance less than the depth of the opening (2) in relation to the thickness of the first layer and the different rates at which the first and second layers 4 and 5 are etched. An electrically conductive layer (6) is then provided on the covering layer (3) to form an electrical contact with the exposed area (10) of the electrically conductive level (1).

8 Claims, 2 Drawing Sheets

METHOD OF MANUFACTURING A SEMICONDUCTOR DEVICE

This invention relates to a method of manufacturing a semiconductor device, which method comprises providing electrical contact to an area of an electrically conductive level exposed through an opening in a covering layer by providing a further layer over the covering layer, etching the further layer anisotropically so as to expose the surface of the covering layer and the area of the electrically conductive level thereby leaving portions of the further layer on side walls of the opening bounding the exposed area, and providing an electrically conductive layer on the covering layer to form an electrical contact with the exposed area of the electrically conductive level.

Such a method is described in U.S. Pat. No. 4,641,420 where the electrically conductive level to be contacted may be a doped silicon region. Although the remaining portions or spacers of the further layer, for example a silicon dioxide layer as described in U.S. Pat. No. ,4,641,420 do indeed serve to smooth the side walls of the opening to enable better coverage by the subsequent electrically conductive layer, which may be an aluminium layer, the walls of the spacers or remaining portions can still be quite steep particularly near the bottom of the opening or access hole resulting in a relatively sharp bend or angle between the contact area and the walls of the spacers or remaining portions of the further layer at which breaks or weaknesses in the electrically conductive layer could occur.

It is an object of the present invention to provide a method of manufacturing a semiconductor device in which the spacers or remaining portions of the further layer are formed in a manner which aims at reducing the sharpness of the bend or angle between the contact area and the walls of the spacers or remaining portions of the further layer so as to reduce the possibilities of breaks or weaknesses occuring in the electrically conductive layer.

According to the present invention, there is provided a method of manufacturing a semiconductor device, which method comprises providing electrical contact to an area of an electrically conductive level exposed through an opening in a covering layer by providing a further layer over the covering layer, etching the further layer anisotropically so as to expose the surface of the covering layer and the area of the electrically conductive level thereby leaving portions of the further layer on side walls of the opening bounding the exposed area, and providing an electrically conductive layer on the covering layer to form an electrical contact with the exposed area of the electrically conductive level, characterised by providing the further layer by providing a first layer of one material to a first thickness on the covering layer and a second layer of a different material to a second thickness on the first layer and anisotropically etching the further layer using an anisotropic etching process which etches the first and second layers at different rates with the first layer being etched more slowly than the second layer so that, after the anisotropic etching to expose the surface of the covering layer and the area of the electrically conductive level, the side walls of the opening remain covered by the said one material and portions of the different material extend on the one material from the exposed area up the side walls of the opening for a distance less than the depth of the opening and related to the thickness of the first layer and the different rates at which the first and second layers are etched.

Thus, in a method embodying the invention, the further layer comprises first and second layers of different material which are etched at different rates during the anisotropic etching to result in the portions of the first and second layers remaining after the anisotropic etching being of different heights thereby providing spacers with more gently sloping walls particularly adjacent the area of the electrically conductive level to be contacted so that the possibilities of breaks or weaknesses in the subsequent metallisation occuring in this region should be reduced. Moreover, the distance which the remaining portions or spacers of the second material (and thus the shape and slope of the surface over which the electrically conductive layer is provided to contact the area of the electrically conductive level) extend up the side walls of the opening may simply be selected by determining the different rates at which the first and second layers are etched by selecting an appropriate anisotropic etching process and/or by selecting the thickness of the first layer. Further using a method embodying the invention where the first layer is etched more slowly than the second layer enables precise determination of the end point of the anisotropic etching by conventional automatic means.

Moreover, in a method embodying the invention, the size of the contact area of the electrically conductive level exposed after the anisotropic etching is related to the thickness of the second layer and accordingly the size of the contact area exposed after the anisotropic etching may be adjusted as desired by selecting the thickness of the second layer. The use of a method embodying the invention should also result in a contact area which is smaller than the opening in the covering layer. Thus, by using a method embodying the invention, the opening in the covering layer may be made larger than the actual desired contact area so that, for example, problems involved in photolithographically defining small windows in a photosensitive resist mask layer in order to enable formation of the opening may be avoided or at least reduced.

In a preferred embodiment, the covering layer is provided as an insulating layer and the opening formed by anisotropically etching the insulating layer through a mask.

Figure 5:
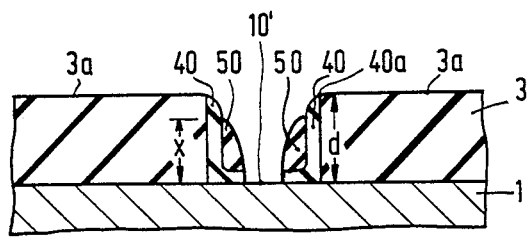
Figure 6:
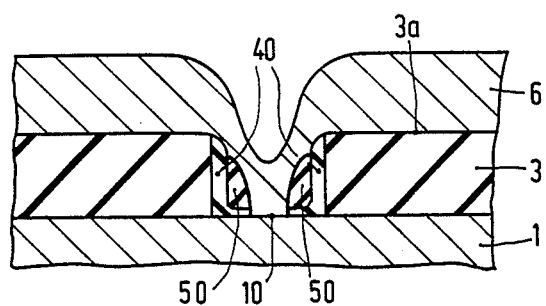
Figure 7:
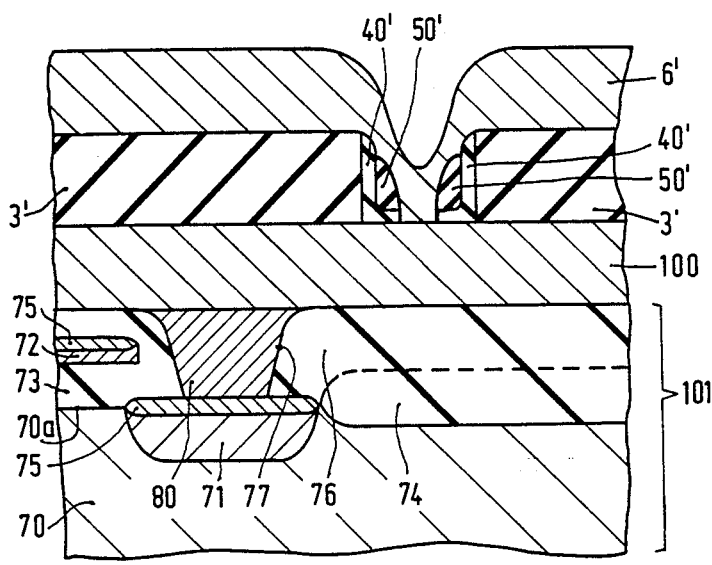

The first and second layers are normally insulating layers, although electrically conductive layers could be used. One of the first and second layers may be provided as a layer of silicon dioxide and the other of the first and second layers as a layer of silicon nitride. Where the first layer is a layer of silicon nitride and the second layer a layer of silicon dioxide, the further layer may be anisotropically etched using a fluorine-containing plasma. Embodiments of the invention will now be described, by way of example, with reference to the accompanying drawings, in which:

FIGS. 1, 2, 3, 4, 5 and 6 are cross-sectional views of part of a semiconductor body illustrating various steps in a method embodying the invention; and FIG. 7 is a cross-sectional view of part of a semiconductor device manufactured using a method embodying the invention.

It should be noted that the Figures are diagrammatic and not drawn to scale. The relative dimensions and proportions of parts of the Figures (particularly in the direction of thickness) have been shown exaggerated or diminished for the sake of clarity and convenience in the drawings. The same (or related) reference signs as used in one embodiment are generally used for referring to corresponding or similar parts in other embodiments.

Referring now to the drawings and especially to FIGS. 1 to 6, a method embodying the invention of manufacturing a semiconductor device comprises providing electrical contact to an area 10 of an electrically conductive level 1 exposed through an opening 2 in a covering layer 3 by providing a further layer 4, 5 over the covering layer 3, etching the further layer 4, 5 anisotropically so as to expose the surface 3a of the covering layer 3 and the area 10 of the electrically conductive level thereby leaving portions 40, 50 of the further layer 4, 5 on side walls 2a of the opening 2 bounding the exposed area 10, and providing an electrically conductive layer 6 on the covering layer 3 to form an electrical contact with the exposed area 10 of the electrically conductive level.

In accordance with the invention, the further layer 4, 5 is provided by providing a first layer 4 of one material to a first thickness a on the covering layer 3 and a second layer 5 of a different material to a second thickness b on the first layer 4 and anisotropically etching the further layer 4, 5 using an anisotropic etching process which etches the first and second layers 4 and 5 at different rates with the first layer 4 being etched more slowly than the second layer 5 so that, after the anisotropic etching to expose the surface 3a of the covering layer 3 and the area 10 of the electrically conductive level 1, the side walls 2a of the opening 2 remain covered by the one material 40 and portions 50 of the different material extend on the one material 40 from the exposed area 10 up the side walls 2a of the opening 2 for a distance less than the depth of the opening 2 and related to the thickness a of the first layer 4 and the different rates at which the first and second layers 4 and 5 are etched.

An example of a method embodying the invention will now be described in greater detail.

Referring first to FIG. 1, the electrically conductive level 1 in this example is a metal level, for example an aluminium level, which is provided as part of a substructure (not shown in FIGS. 1 to 6) of the semiconductor device. The aluminium level may be coated with a protective layer of a non-aluminium-containing electrical conductor such as titanium, tungsten, molybdenum, cobalt, chromium, hafnium, or alloys or silicides of any of the above. As will be described below with reference to FIG. 7, the aluminium level may be final metallisation level of the semiconductor device or may be an intermediate metallisation level. The electrically conductive level need not necesarily be a metallisation level but could be, for example, a doped polycrystalline silicon level, for example forming the conductive gate of an insulated gate or even, for example, a doped region, such as a source or drain region of an insulated gate field efect transistor. It should of course be appreciated that the electrically conductive level 1 may be patterned, for example to provide the desired metallisation pattern or insulated gate structure, and that only part of one region of the conductive level is shown in the Figures.

Where, as in this example, the electrically conductive level 1 is formed of aluminium, then the aluminium may be provided on the underlying substructure (not shown in FIGS. 1 to 5) using a conventional technique such as sputter depostion or chemical vapour deposition and may have a thickness of about, for example, one micrometer.

The covering layer 3 is, in this example, provided on the electrically conductive level 1 as a layer of silicon dioxide which may be deposited using any suitable conventional technique, for example a plasma enhanced chemical vapour depostion technique or a low pressure chemical vapour deposition technique using, for example, an organo-silane compound such as TEOS (triethyloxysilane). The covering layer 3 may have a thickness of, for example, about 0.7 micrometer.

After formation of the covering or insulating layer 3, a layer 11 of a conventional photosensitive resist, for example a positive photosensitive resist such as HPR204 produced by the Hunt Company, is spun onto the covering layer 3 to a thickness of, for exammple, about 1.3 micrometers and patterned using conventional photolithographic and mask patterning techniques to define a photosensitive resist mask having a window 12 where the opening 2 is to be formed. Although as will be appreciated from the above the photosensitive resist layer 11 will be nearly twice as thick as the covering layer 3, in the interests of conciseness the resist layer 11 has been shown in FIG. 1 somewhat thinner than it would be in practice.

The covering layer 3 is then etched anisotropically through the window 12 to form the opening 2, thereby exposing an area 10 of the electrically conductive level 1. FIG. 1 shows the structure after formation of the opening 2 with the original extent of the covering layer 3 and the mask 11 prior to the opening of the window 12 and the anisotropic etching shown in dotted lines. It should, of course, be appreciated that the opening 2 may have any desired shape when viewed from above, that is looking down on the surface 3a of the covering layer 3, and may be a circular or near circular opening in which case the side walls 2a will be continuous and will in effect form a single wall although referred to herein as side walls 2a.

The covering layer 3 may be etched using any suitable anisotropic etching technique. Thus, for example, a fluorine-containing plasma (for example a fluorocarbon plasma such as a $CF_4$, $CHF_3$ or $CxFy$ (e.g. $C_2F_6$) plasma where the covering layer 3 is a silicon dioxide layer or an $SF_6$ or $NF_3$ plasma where appropriate for the insulating material forming the covering layer 3) in an inert carrier gas, for example argon, may be used to etch the opening 2.

In this example, the opening 2 may have a width of about one to two micrometers.

Figure 2:
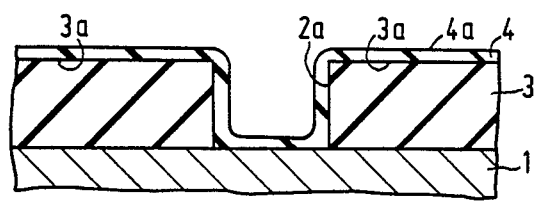

After the opening 2 has been formed, the photosensitive resist mask 11 is removed using conventional techniques to expose the surface 3a of the covering layer 3. As shown in FIG. 2, the first layer 4 is then provided as a thin layer of silicon nitride using a conventional technique, such as plasma enhanced chemical vapour deposition, so as to cover the surface 3a of the covering layer 3, the side walls 2a of the opening and the exposed contact area 10. In this example, the silicon nitride layer 4 may have a thickness of about 100 nanometers (nm).

Figure 3:
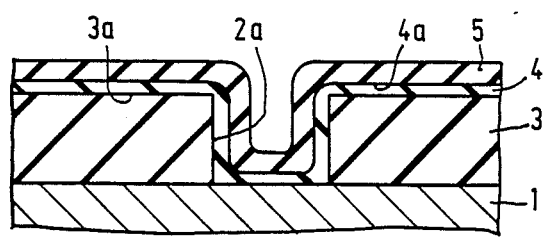

Referring now to FIG. 3, after the first layer 4 of silicon nitride has been formed, the second layer 5 is provided as a layer of silicon dioxide which again may be provided using any suitable technique, for example plasma enhanced chemical vapour deposition. The second layer 5 of silicon dioxide covers the entire silicon nitride first layer 4 and may have a thickness of about 200nm. After the second layer 5, in this example a layer of silicon dioxide, has been provided to complete the further layer, the further layer 4, 5 is etched anisotropically, for example by an anisotropic plasma etch, using a technique which etches the first layer 4 more slowly than the second layer 5 as will be described below with reference to FIGS. 4 and 5.

In this example where the first and second layers 4 and 5 are formed of silicon nitride and silicon dioxide, respectively, then the anisotropic etching may be carried out using a fluorocarbon plasma such as carbon tetrafluoride ($CF_4$), $CHF_3$ or $C_xF_y$ (e.g. $C_2F_6$) in argon as a carrier gas. In this example a combined carbon tetrafluoride and $CHF_3$ plasma is used which etches the silicon dioxide second layer 5 at least twice as quickly as the silicon nitride first layer 4.

Figure 4:
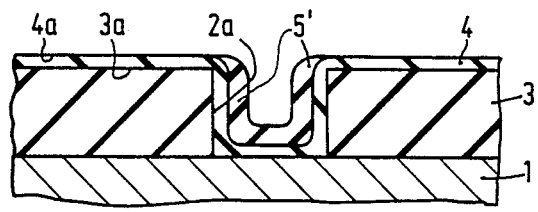

The progress of the anisotropic etching is monitored by conventional techniques, in this case by examining the spectrum of the constituents in the plasma in particular the carbon monoxide emission line (at 483 nm) of the spectrum. Thus, the intensity of the carbon monoxide line is initially high as the silicon dioxide second layer 5 is etched and then drops sharply as the top surface 4a of the silicon nitride first layer 4 is exposed as shown in FIG. 4 and finally rises sharply when the silicon nitride first layer 4 has been removed from the top surface 3a of the covering layer 3 so that the silicon dioxide of the covering layer 3 starts to be etched. Thus, using a method embodying the invention the presence of the first layer 4 enables precise determination of the end point of the anisotropic etching by conventional automatic means. The point, shown in FIG. 5, at which the silicon nitride first layer 4 has been removed from the top surface 3a of the covering layer 3 and thus also the point at which the final contact area 10' is exposed can therefore be readily and precisely detected and the anisotropic etching process stopped at this point, possibly with a slight over-etch to ensure that the plasma silicon nitride first layer 4 has been removed from the top surface 3a of the covering layer 3 and that the surface of the final contact area 10' is free of insulating material to facilitate a good electrical contact to the electrically conductive layer 6 to be provided thereon.

As the etching technique used is anisotropic and so etches the further layer in one direction only, that is perpendicular to the surface 3a of the covering layer 3, when the plasma silicon nitride layer surface 4a is just exposed, the side walls 2a of the opening 2 remain covered by the silicon nitride first layer 4 and by parts 5' of the silicon dioxide second layer 5 as shown in FIG. 4. Because the anisotropic etching etches the material of the second layer 5, silicon dioxide in this example, more quickly than the material of the first layer 4, silicon nitride in this example, then in the time taken for the anisotropic etching to remove the silcon nitride from the surface 3a of the covering layer, a greater thickness of the silicon dioxide on the side walls 2a of the opening 2 than of the silicon nitride is removed. Thus, as indicated in FIG. 5 at the end of the anisotropic etching, the side walls 2a of the opening 2 remain covered by remaining portions or spacers 40 of the first layer 4 and, in addition, remaining portions or spacers 50 of the second layer 5 are left on the spacers 40. The remaining portions or spacers 50 of the silicon dioxide second layer 5 extend from the exposed or final contact area 10' up the side walls 2a of the opening 2 for a distance x less than the depth d of the opening. The spacers or remaining portions 50 of the second layer 5 thus extend only part way up the remaining portions or spacers 40 of the first layer 4 and therefore provide, as can be seen from FIG. 5, a stepped profile to the wall of the opening 2 bounding the final contact area 10.

After the anisotropic etching has been stopped, the electrically conductive layer 6 is provided as illustrated schematically in FIG. 6. In this example the electrically conductive layer 6 is provided as a further level of aluminium which is deposited in the same manner as the electrically conductive level 1.

The provision of the first and second layers 4 and 5 of different materials so that the first layer 4 is etched more slowly than the second layer 5 results in, as indicated diagrammatically in FIG. 5, a stepped or double spacer formed of the remaining portions 40 and 50 of the first and second layers 4 and 5 so that the side walls 2a of the contact hole or opening 2 have a considerably more gentle slope than would otherwise be the case. Furthermore, as indicated in FIG. 5, the anisotropic etching of the first and second layers 4 and 5 results in a slight rounding of the top 40a of the remaining portions 40 of the first layer 4. Thus, using a method embodying the invention enables the electrically conductive level 6 to be provided onto a surface which has relatively gentle slopes and corners rather than near vertical slopes and sharp corners so that problems such as inadequate coverage or weaknesses or even breaks in the electrically conductive level 6 which are liable to occur where near vertical slopes and sharp corners are present can be avoided or at least reduced. Moreover, as will be appreciated from FIG. 5, the use of a method embodying the invention results in a final contact area 10' which is somewhat smaller in area than the original opening 2 so that, particularly where the dimensions involved are small, of the order of a micrometer or less, the original opening 2 in the further layer 3 may be made larger in cross-sectional area than the desired final contact area 10' which means that the window defined in the photosensitive resist mask layer 11 may be larger than the desired final contact area 10' and so the problems involved in photolithographically defining very small windows in photosensitve resist mask layers may be avoided or at least reduced.

As indicated above, the height x of the spacers 50 extending up the side walls 2a of the opening 2 is related to the different rates at which the first and second layers 4 and 5 are etched, that is the selectivity S of the anisotropic etching process used, and the thickness a of the first layer 4.

Where, as in the arrangement described above, the first and second layers 4 and 5 are formed of silicon nitride and silicon dioxide, respectively, and the anisotropic etching process etches the silicon dioxide about twice as quickly as the silicon nitride, once the surface 4a of the silicon nitride layer 4 has been exposed as shown in FIG. 4, in the time taken to remove the thickness of the silicon nitride first layer 4 from top surface 3a of the covering layer 3, about twice the thickness of the silicon dioxide second layer 5 is removed from the side walls 2a of the opening 2 so that where, as in the example given above, the first layer 4 has a thickness of 100 nanometers then about 200 nanometers thickness of the second layer 5 is removed from the sides walls 2a of the opening.

The inventor has found that, generally, the height x of the spacers 50 can be given by the formula $(d-x)=(S-1)a$ where d, x, S and a are as indicated above so that where the second layer 5 is etched twice as quickly as the first layer 4 giving a selectivity S of 2 and the first layer 4 has a thickness a of 100 nanometers then $(d-x)=(-1)100=100$ nanometers. Thus, where in the example given above the depth of the opening $d=0.7$ micrometers, $x=600$ nanometers.

The distance x that the remaining portions or spacers 50 extend up the side walls 2a of the opening may be selected by selecting the anisotropic etching process. Thus, for example, if the anisotropic etching process etches the second layer 5 three times more quickly than the first layer 4 giving a selectivity S of 3 then, with the same thickness a for the first layer, (d-x) would equal 200 nanometers giving, for $d=0.7$ micrometers, $x=500$ nanometers. A similar result would be obtained by keeping the selectivity $S=2$ and adjusting the thickness a of the first layer 4 to 200 nanometers although the size of the opening 2 places constraints on increasing the thickness of the first and second layers.

Of course both the thickness a of the first layer 4 and the selectivity S may be selected or adjusted to give the desired height x for the spacers 50. Although the thickness of the second layer 5 does not affect the height x of the spacers 50 it will affect the size of the final contact area 10' exposed after the anisotropic etching in that the final contact area 10' will have a width, for example a diameter where the contact area 10' is circular, and about equal to the width of the opening 2 (diameter where the opening 2 is circular in cross-section) minus twice the thickness of the first and second layers 4 and 5 combined. If the second layer 5 is made thicker or thinner, than the remaining portions or spacers 50 left after the anisotropic etching will be correspondingly thicker or thinner and so the final contact area 10' will be smaller or larger. Thus, the size of the final contact area 10' can be selected by selecting the thickness of the second layer 5, allowing the opening 2 to be larger than the desired final contact area 10', thereby to enable the window 12 in the photosensitive resist mask layer 11 used to define the opening 2 to be larger than the desired contact area 10' so that the problems which may arise in photolithographically of defining small, of the order of 1 to 2 micrometers, windows in the mask layer 11 can be avoided or at least reduced.

In the example described above, the first and second layers 4 and 5 are formed of silicon nitride and silicon dioxide, respectively. However, any suitable two different insulating materials can be used to form the first and second layers 4 and 5 provided that an anisotropic technique is available which will allow the first layer to be etched more slowly than the second layer. Thus, for example, one of the first and second layers may be a polyimide or silicon oxynitride layer while the other may be a silicon nitride or silicon dioxide layer. Also, the first layer 4 could be a silicon dioxide layer and the second layer 5 a silicon nitride layer, in which case the anisotropic etching proces would be selected so as to etch the silicon nitride more quickly than the silicon dioxide, for example an $SF_6$ plasma containing oxygen again in an inert carrier gas such as argon could be used.

As an alternative to using silicon nitride which has a tendency to be rather dirty or contaminated, the first and second layers 4 and 5 could both be formed of silicon dioxide with the second layer 5 being doped so as to ensure that the second layer 5 etches more quickly than the first layer 4. However the selectivity S of etching between undoped and doped silicon dioxide is normaly not very high and will usually be less than two.

The first layer 4 could be an aluminium oxide ($Al_2O_3$) layer which would have the advantage that the $Al_2O_3$ layer would be etched considerably more slowly than the second layer 5 which may again be a silicon dioxide layer. However, where $Al_2O_3$ is used as the first layer, it may be necessary, once the spacers 50 have been formed, to carry out a further step in the anisotropic etching process, for example adjusting the content of the plasma where an anisotropic plasma etching process is used, so as to remove remaining aluminium oxide from the desired constant area 10'. Phosphous trichloride may be used to remove any such remaining aluminium oxide.

FIG. 7 is a schematic cross-sectional view illustrating part of a monocrystalline silicon semiconductor body 70 of an electronic device, for example an integrated circuit such as a CMOS integrated circuit having metallisation levels provided, using a method in accordance with the invention.

The part of the semiconductor body 70 shown in FIG. 7 has a doped region 71 adjacent a surface 70a of the body 70. The semiconductor body 70 will of course incorporate many such doped regions. The particular region 71 shown in FIG. 7 forms a source or drain region of an insulated gate field effect transistor (MOST). An insulated gate for the MOST is provided on the surface 70a of the body 70 by a doped polycrystallisation silicon conductive gate 72 deposited onto a thin silicon dioxide gate layer 73. Field oxide 74 (indicated in part by a dashed line in FIG. 7) formed by local oxidation of silicon (LOCOS) in a known manner defines the area of the MOST.

In order to provide lower contact resistance to subsequent metallisation, titanium is sputter-deposited over the surface 70a and the body 70 is then heated rapidly to form a titanium silicide contact layer 75 at the exposed silicon surface areas, that is on the doped region 71 and on the polycrystalline silicon gate layer 72. The remaining titanium on the insulating material may be removed by etching in a solution of, for example, hydrogen peroxide and ammonium hydroxide in water. Other silicides such as cobalt silicide could be used in place of the titanium silicide.

An insulating layer 76 is then deposited by chemical vapour deposition onto the surface. Using conventional photolithographic and etching technique, a via 77 is opened through the insulating layer 76 to enable connection to subsequent metallisation.

A conductive plug 80 may be formed by first depositing an adhesion layer (not shown) onto the insulating layer 76 and into the via 77 to improve the adhesion to the insulating material of a subsequently-deposited tungsten layer. The adhesion layer may be, for example, titanium or titanium-tungsten and may be sputter-deposited as is known in the art. After deposition of the tungsten, for example by chemical vapour deposition, the deposited material is etched back, for example using an $SF_6$ plasma etching step, to expose the surface of the insulating layer 76 leaving the plug 80 of tungsten within the via 77. An electrically conductive level of metallisation, in this example an aluminium level 100, may then be formed in a conventional manner by sputter deposition and patterning. Alternatively, the plug 80 could be omitted and the electrically conductive level deposited directly onto the via 77.

In this example, the electrically conductive level 100 corresponds to the electrically conductive level 1 shown in FIGS. 1 to 5 with the underlying insulating layers and semiconductor body forming a substructure 101 of the device on which the electrically conductive level 100 is provided.

A method embodying the invention is then used as described above to enable a further layer of metallisation 6' to contact the electrically conductive level 100 via an opening 2' formed in a covering insulating layer 3' and provided with spacers 40' and 50' in the manner described above. Where the further layer 6' is the final metallisation layer, a passivating layer (not shown in FIG. 7) may be provided over the further metallisation as is conventional in the art.

Thus, in the example shown in FIG. 7, a method embodying the invention is used to enable a second, possibly a final level of metallisation to be provided and interconnected to an underlying, as shown a first, level of metallisation. A method in accordance with the invention may however be used to enable second, third, fourth etc. levels of metallisation to contact the underlying i.e. first, second, third etc. level of metallisation as will be appreciated from FIG. 7. In addition, a method embodying the invention could be used, especially where the tungsten plug is not provided, to facilitate connection of the first metallisation level to regions of the semiconductor body for example the region 71 shown in FIG. 7 and/or to the insulated gate 73, 72 or to other surface features such as conductive straps.

Although, in the methods described above, the first and second layers 4 and 5 are insulating layers, this need not necessarily be the case and, indeed, the first and second layers could be electrically conductive layers, for example a tungsten and a titanium-tungsten alloy layer, respectively.

Also, although in the methods described above with reference to the Figures, the further layer is formed by first and second layers 4 and 5 it may be possible to form the further layer of three or even more layers each of which is etched at a different rate by the selected anisotropic etching process so that the first layer is etched most slowly, and the final layer most quickly thereby providing a triple or more stepped spacer arrangement on the sidewalls 2a of the opening.

From reading the present disclosure, other modifications will be apparent to persons skilled in the art. Such modifications may involve other features which are already known in the art and which may be used instead of or in addition to features already described herein. Although claims have been formulated in this application to particular combinations of features, it should be understood that the scope of the disclosure of the present application also includes any novel feature or novel combination of features disclosed herein either explicitly or implicitly or any generalisation or modification of that feature or of one or more of those features whether or not it relates to the same invention as presently claimed in any claim. The applicants hereby give notice that new claims to such features and/or combinations of such features may be formulated during the prosecution of the present application or of any further application derived therefrom.

I claim:

1. A method of manufacturing a semiconductor device comprising the steps of (a) providing a covering layer over an electrically conductive layer,
   (b) forming at least one opening in said covering layer to expose said electrically conductive layer,
   (c) forming a further layer on said covering layer and into said opening to cover said electrically conductive layer, said further layer comprising at least a first layer of one material, said first layer having a first thickness, and at least a second layer of a different material on said first layer, said second layer being of a second thickness,
   (d) anisotropically etching said further layer to etch said first layer and said second layer at different etching rates, said first layer being etched more slowly than said second layer,
   (e) continuing said anisotropic etching until said further layer is removed from said covering layer, and said further layer is removed at least partially from said electrically conductive layer in said opening, at least a first portion of said first layer and at least a second portion of said second layer remaining on side walls of said opening, said first portion of said first layer covering said side walls of said opening from said electrically conductive layer to a top of said covering layer, said second portion of said second layer extending from said electrically conductive layer to a distance less than a depth of said opening, said distance being related to said first thickness of said first layer and to the different rates of etching of said first layer and said second layer, and
   (f) providing another electrically conductive layer on said covering layer and into said opening to form an electrical contact with remaining exposed portions of said electrically conductive layer.

2. A method according to claim 1, wherein step (a) is carried out by providing said covering layer from insulating material, and wherein said step (d) is carried out by using a mask to anisotropically etch said insulating material.

3. A method according to claim 1, wherein said step (c) is carried out by forming both said first layer and said second layer from insulating material.

4. A method according to claim 3, wherein one of said first and second layers is formed of silicon dioxide and the other of said first and second layers is formed of silicon nitride.

5. A method according to claim 4, wherein said first layer is formed of silicon nitride and said second layer is formed of silicon dioxide.

6. A method according to claim 5, wherein said step (d) is carried out by using a fluorine-containing plasma.

7. A method according to claim 1, wherein said step (d) is carried out by using a fluorine-containing plasma.

8. A method according to claim 1, wherein step (e) is carried out to form said distance according to the general formula $$(d-x) = (S-1)a$$

where "d" equals said depth of said opening, "x" equals a height of said second portion, "S" equals a selectivity of anisotropic etching, and "a" equals thickness of said first layer, and wherein said value "S" is at least 2.

* * * * *